(12) United States Patent
Liu et al.

(10) Patent No.: US 10,286,689 B1
(45) Date of Patent: May 14, 2019

(54) UV PRINTED TRANSFERRABLE MATERIALS

(71) Applicant: Xerox Corporation, Norwalk, CT (US)

(72) Inventors: Chu-heng Liu, Penfield, NY (US); Jason M. LeFevre, Penfield, NY (US); Seemit Praharaj, Webster, NY (US); Douglas K. Herrmann, Webster, NY (US); Paul J. McConville, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/892,116

(22) Filed: Feb. 8, 2018

(51) Int. Cl.
*B41M 5/00* (2006.01)
*B41J 11/00* (2006.01)
*G03F 1/00* (2012.01)

(52) U.S. Cl.
CPC .......... *B41J 11/002* (2013.01); *G03F 1/0023* (2013.01); *B41M 5/00* (2013.01)

(58) Field of Classification Search
CPC .......... B41M 5/00; B41M 5/03; B41M 5/405; B41M 2205/30; B41M 2205/40; B41J 11/002
USPC .......... 428/32.76, 32.77, 32.79, 32.81, 195.1
See application file for complete search history.

(56) References Cited

U.S. PATENT DOCUMENTS 9,757,922 B2 * 9/2017 Miracle .................... B32B 7/06

* cited by examiner

*Primary Examiner* — Bruce H Hess

(57) ABSTRACT

A UV printed transferrable material and a method for producing the same are disclosed. For example, the UV printed transferrable material includes a first liner, a UV ink layer on top of the first liner in a desired image, a primer layer on top of the UV ink layer, wherein the UV ink layer and the primer layer are cured, and a second liner on top of the primer layer.

20 Claims, 4 Drawing Sheets

UV PRINTED TRANSFERRABLE MATERIALS

The present disclosure relates generally to transferrable materials and, more particularly, to ultraviolet (UV) printed transferrable materials.

BACKGROUND

Businesses use signage to display store names, product labels, and the like on a variety of different products and buildings. The products may have a variety of different sizes and shapes. Signage can be created in a variety of different ways. For example, traditionally the signage may be printed on paper or a label that is then adhered to the product. In other instances, businesses may use lighting or electronic signs for a storefront.

In addition to businesses, there may be use for signage at a residential level. For example, some families may decorate a room with personalized images, decals, and the like. Some decorations may be painted directly onto the walls. Other materials may include inks or paints that can be removably applied onto windows, and the like.

Thus, there are many uses for signage from business uses to residential uses. However, the current methods to generate labels may have drawbacks such as being two-dimensional, hand drawn, or difficult to apply.

SUMMARY

According to aspects illustrated herein, there are provided UV printed transferrable material and a method for producing the same. One disclosed feature of the embodiments is a UV printed transferrable material comprising a first liner, a UV ink layer on top of the first liner in a desired image, a primer layer on top of the UV ink layer, wherein the UV ink layer and the primer layer are cured, and a second liner on top of the primer layer.

Another disclosed feature of the embodiments is a method for producing the UV printed transferrable material. In one embodiment, the method provides a first liner, applies UV ink on the first liner, applies a primer on the UV ink to form a primer layer, cures the UV ink and the primer, and applies a second liner onto the primer layer that is cured.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses UV printed transferrable materials and methods for producing the same. As discussed above, signage can be used for a variety of different applications for business and residential purposes. Current methods may include expensive electronic signs to simple two-dimensional printed labels.

Some instances of printing textured or raised signage may be applied directly to the surface of a print medium (e.g., business cards). Other examples provide a more difficult problem when trying to print raised or textured images on an odd shaped product.

Embodiments of the present disclosure provide a UV printed transferrable material that can be easily applied to any shaped product of a variety of different surfaces. Thus, the present disclosure provides a flexible solution to having to print directly onto odd shaped products. Instead, the desired image or signage can be printed onto a removable backing and applied to a desired surface. The UV printed image or signage can be flexible and allow for easy application onto any shaped or curved surface, as well.

Figure 1:
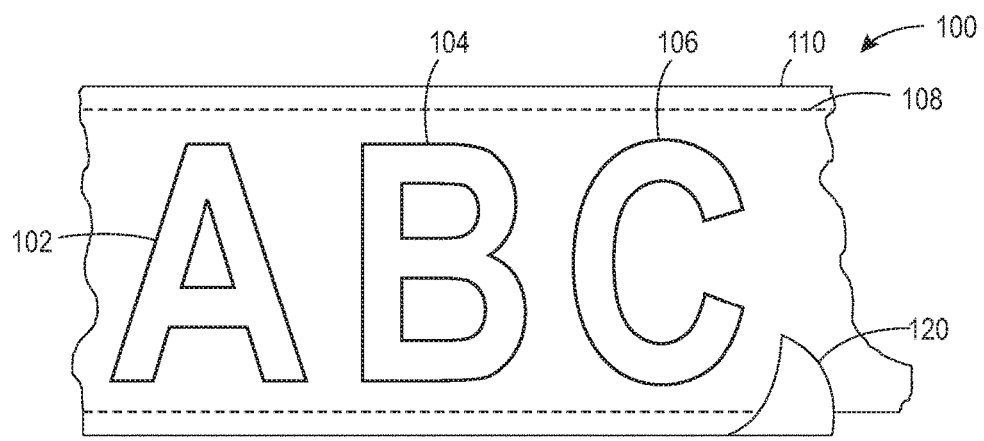
FIG. 1 illustrates a top view of an example UV printed transferrable material of the present disclosure.

FIG. 1 illustrates an example UV printed transferrable material 100. In one example, the UV printed transferrable material 100 may include a desired pattern that is printed on top of a first liner 108 (shown in dashed lines) and covered by a second liner 110. For example, the desired pattern may be any type of image or text.

In one embodiment, the desired pattern may be text such as letters 102, 104, and 106. Although FIG. 1 illustrates the desired pattern being letters, it should be noted that the desired pattern may be any type of text, numbers, or image. In one example, the desired pattern may be printed with UV inks and cured to have a desired spacing and pattern. For example, the letters 102, 104, and 106 may be arranged with any spacing (e.g., random or consistent) and pattern (e.g., straight line, curved, staggered, and the like).

The second liner 110 may be removed as shown by a raised corner 120. The desired pattern may be pressed against a surface (e.g., a glass surface, a smooth metallic surface, a wall, and the like). The desired pattern may adhere to the surface in the desired spacing and pattern. In other words, a user does not have to individually place each letter or image manually at a desired spacing. Rather, the desired pattern may be printed onto the first liner 108 with the desired spacing and pattern. After the desired pattern is adhered to the surface, the second liner 110 may be removed.

Figure 2:
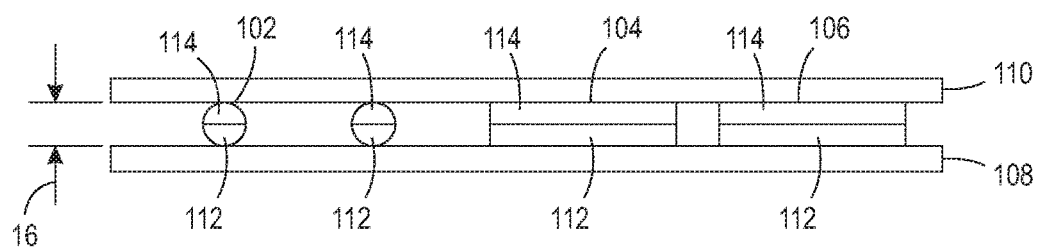
FIG. 2 illustrates a side view of the example UV printed transferrable material of the present disclosure.

FIG. 2 illustrates a side view of the UV printed transferrable material 100. In one embodiment, the UV printed transferrable material 100 may include a first liner 108, a UV ink layer 112, a primer layer 114, and a second liner 110. In one example, the UV ink layer 112 may be printed on top of the first liner 108 in a desired pattern. The primer layer 114 may be jetted, printed, or applied on the UV ink layer 112. The UV ink layer 112 and the primer layer 114 may be cured. It should be noted that the primer layer 114 is shown with some thickness for illustrative purposes. However, the primer layer 114 may be a coating that has no significant thickness.

In one embodiment, the UV ink layer 112 may have a thickness 116 of approximately 5-70 microns (μm). The UV ink layer 112 may be printed over multiple passes to the desired thickness. However, the UV ink layer 112 may have any desired length and width. For example, the letters 102, 104, and 106 may be centimeters wide and long to be applied to a can, the letters 102, 104, and 106 may be several feet wide and long to be applied to a window for a store front, or any size in between. The UV ink layer 112 may have one or more different colored UV inks to print the desired image.

In one embodiment, the primer layer 114 may be any type of primer that is UV curable, ink jettable, and sufficiently sticky to act as an adhesive. In other words, the primer may be dispensed or jetted via print heads similar to the UV inks that are dispensed via print heads.

In one embodiment, the first liner 108 may be a release liner. The first liner 108 may be any type of liner that has a low surface energy. As a result, the primer layer 114 and the UV ink layer 112 may be removably printed onto the first liner 108. In one embodiment, "low surface energy" may be defined to be a surface energy of approximately 30 to 35 dynes per square centimeter. An example of a liner that has the proper amount of surface energy may be a low density polyethylene.

In one embodiment, to ensure that the first liner 108 has a sufficiently low surface energy, the first liner 108 may be treated with a corona treatment. For example, corona plasma may be applied to the first liner 108 to raise the surface energy of the first liner 108 to a desired surface energy level for ink wetting.

In one embodiment, the second liner 110 may be a release liner. The second liner 110 may be any type of liner having a lower adhesion than the primer layer 114. As a result, the second liner 110 may be removably attached to the primer layer 114 for handling and transportation. Examples of suitable materials for the second liner 110 may include polypropylene, polyethylene, and the like.

Figure 3:
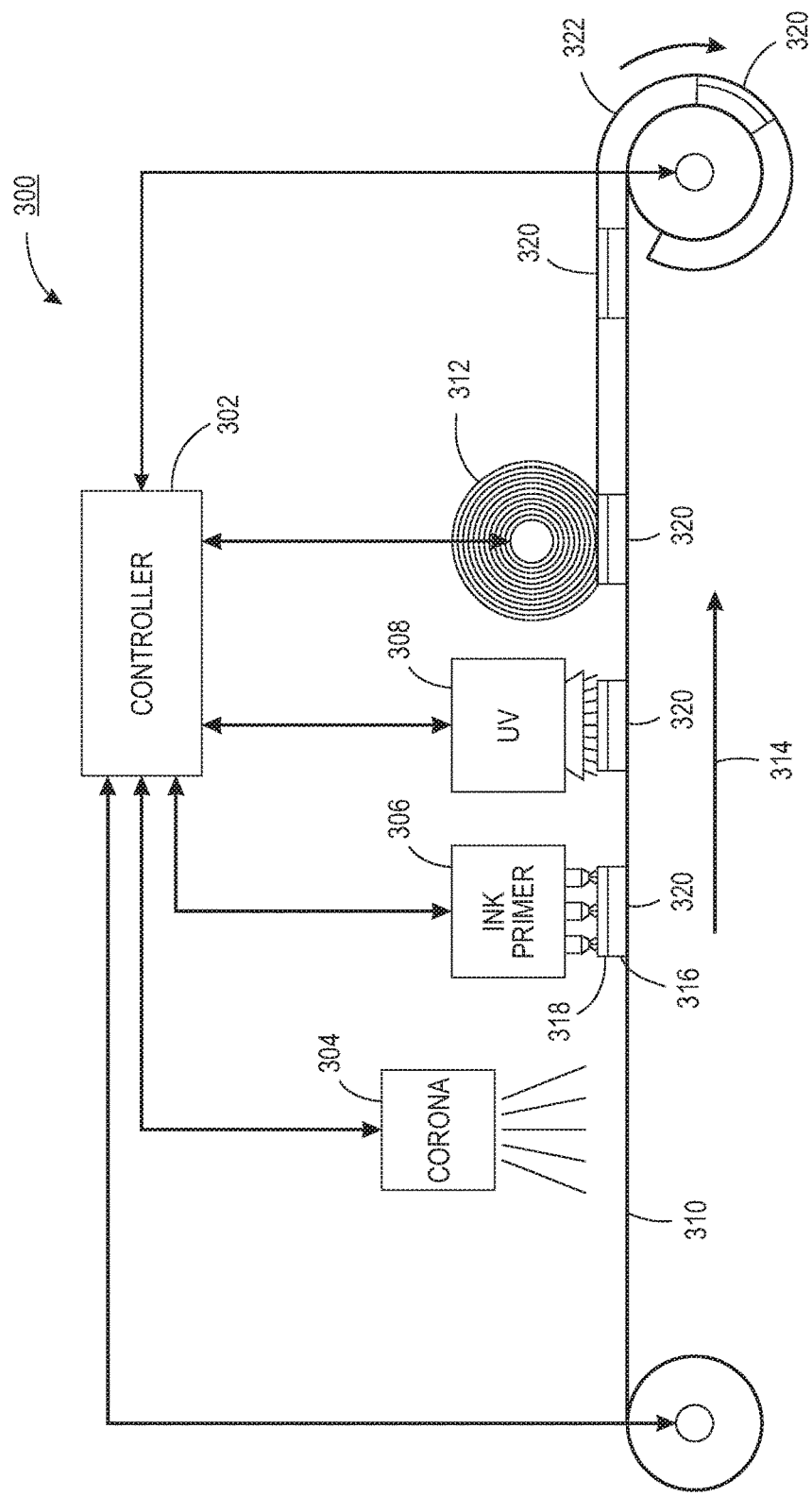
FIG. 3 illustrates a block diagram of an example system for printing the UV printed transferrable material of the present disclosure.

FIG. 3 illustrates an apparatus 300 to produce the UV printed transferrable material 100. In one example, the apparatus 300 may include a roll of a first liner 310, a primer and UV ink print head 306, a UV curing station 308, and a roll of a second liner 312. In one embodiment, a corona gun 304 may be optionally included. The apparatus 300 may include a controller 302 that is communicatively coupled to the optional corona gun 304, the primer and UV ink print head 306, the UV curing station 308, the roll of the first liner 310 and the roll of the second liner 312.

In one embodiment, the controller 302 may include a processor and a non-transitory computer readable medium that stores instructions that are executed by the processor. The instructions may include instructions for operating the apparatus 300 to produce the UV printed transferrable material 100. In one example, the controller 302 may be deployed as a computer.

It should be noted that although the controller 302, the corona gun 304, the primer and UV ink print head 306, and the UV curing station 308 are illustrated as separate components, that one or more of the components may be combined into a single component. In one embodiment, the controller 302, the corona gun 304, the primer and UV ink print head 306, and the UV curing station 308 may be deployed in a single housing as part of a single printing device.

In one example, the controller 302 may unwind the roll of the first liner 310 in a process direction 314. FIG. 3 illustrates an example process direction 314 that moves from left to right. In one embodiment, the first liner 310 may be treated with a corona process to lower the surface energy of the first liner 310, as described above. For example, the corona gun 304 may apply a corona plasma to the first liner 310.

The controller 302 may be loaded with instructions to print a desired image 320. The desired image 320 may be any series of images, text, or numbers that are arranged with a desired spacing and a desired pattern. The desired image 320 may have a desired pattern, a particular thickness, and the like. In one example, the controller 302 may include an input/output interface (e.g., a graphical user interface) that allows an operator or a user to input, select, download, etc., the desired image 320.

The controller 302 may then control the primer and UV ink print head 306 to apply a UV ink layer 316 and the primer layer 318. For example, the controller 302 may dispense the desired color or different colors of UV ink in the desired image 320. In one example, the roll of the first liner 310 may be paused to allow the proper amount of UV ink to be dispensed onto the first liner 310 and a proper amount of primer to be dispensed onto the UV ink layer 316.

The roll of the first liner 310 may then be moved to have the desired image 320 positioned under the UV curing station 308. The UV curing station 308 may apply UV light onto the UV ink and primer to cure, harden, or dry, the UV ink and the primer. The amount of time the desired image 320 is positioned under the UV curing station 308 may be a function of an amount of UV ink, a type of UV ink, and the like, that was printed onto the first liner 310.

After the desired image 320 is cured, the roll of the second liner 312 may be activated by the controller 302. The second liner 312 may be applied on top of the primer layer 318 of the desired image 320 to complete the formation of the UV printed transferrable material 100. In other words, the desired image 320 may be "sandwiched" between the first liner 310 and the second liner 312. The first liner 310 and the second liner 312 may allow the UV printed transferrable material 100 to easily be handled, transported, and applied without damaging the desired image 320.

In one embodiment, a collection roller 322 may be communicatively coupled to the controller 302 and collect the completed UV printed transferrable materials 100. In another embodiment, the completed UV printed transferrable material 100 may be cut and collected rather rolled.

Although FIG. 3 illustrates an apparatus 300 to perform a continuous process for producing the UV printed transferrable material 100, it should be noted that the UV printed transferrable material 100 may also be produced in a batch process. For example, first liner 310 and the second liner 312 may be pre-cut to a desired size. The first liner 310 may be placed below the corona gun 304, the primer and UV ink print head 306, and the UV curing station 308. The second liner 312 may then be placed on top of the primer layer 318.

As a result, the UV printed transferrable material 100 of the present disclosure allows a user to print any desired image having any desired pattern and spacing. In addition, the desired image 320 may be flexible and adhere to any shaped surfaces (e.g., flat, round, curved, oblong, and the like).

In addition, printing the desired image 320 on the first liner 310 allows the desired image 320 to be positioned in the desired spacing and desired pattern. As a result, the user simply has to remove the first liner 310, apply the desired image 320 onto the surface, and then remove the second liner 312. For example, if the desired image 320 is lettering for a word, the user does not have to manually apply each letter and measure the spacing after applying each letter. Rather, the letters would be printed in the desired spacing and pattern to the exact specifications desired by the user. Thus, the UV printed transferrable material 100 of the present disclosure also allows for more efficient and simpler application of the desired image 320 to a surface.

Figure 4:
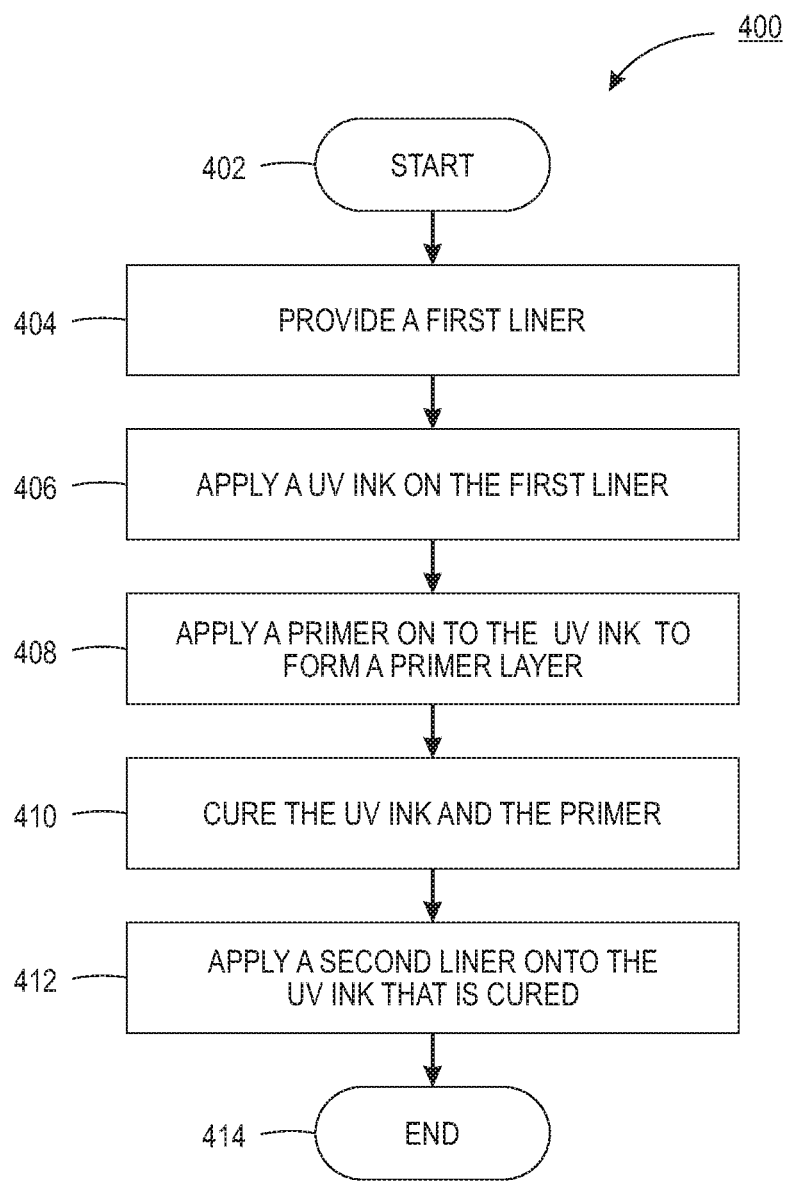
FIG. 4 illustrates a flowchart of an example method for producing a UV printed transferrable material.
Figure 5:
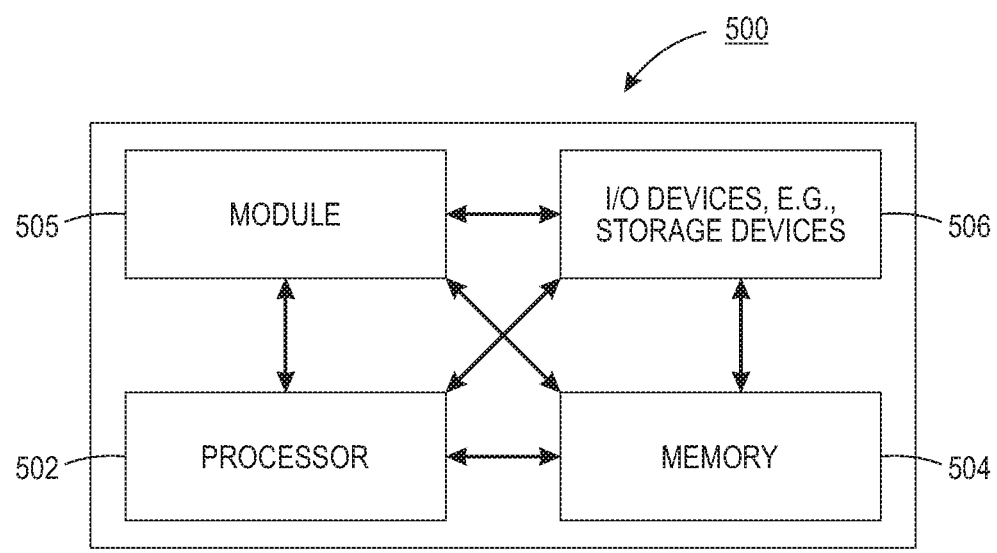
FIG. 5 illustrates a high-level block diagram of an example computer suitable for use in performing the functions described herein.

FIG. 4 illustrates a flowchart of an example method 400 for producing a UV printed transferrable material. In one embodiment, one or more steps or operations of the method 400 may be performed by the apparatus 300 or a computer/processor that controls operation of the apparatus 300 as illustrated in FIG. 5 and discussed below.

At block 402, the method 400 begins. At block 404, the method 400 provides a first liner. In one embodiment, the first liner may be a release liner. The first liner may be any type of liner that has a low surface energy. In one embodiment, "low surface energy" may be defined to be a surface energy of approximately 30 to 35 dynes per square centimeter. An example of a liner that has the proper amount of surface energy may be a low density polyethylene.

In one embodiment, to ensure that the first liner has a sufficient surface energy to wet the UV ink, the first liner may be treated with a corona treatment. For example, corona plasma may be applied to the first liner to temporarily raise the surface energy of the first liner to a desired surface energy level.

At block 406, the method 400 applies a UV ink onto the first liner to print a desired image. The UV ink may comprise a single color of UV ink or a plurality of different colors of UV ink. In one embodiment, the UV ink may be applied in multiple passes to print the desired image to a desired thickness. In one example, the UV ink may be applied to a thickness between approximately 5-70 µm. The UV ink may be dispensed via print head.

In one embodiment, a low amount of UV energy may be applied to the UV ink to perform a pinning operation. The pinning operation may allow the UV ink to move to a higher viscosity without being fully cured. The curing for the pinning operation may be performed by the UV curing station 320 (e.g., the UV curing station 320 may be controlled to apply different amounts of UV energy for the pinning operation and the full curing operation, discussed below) or a different UV curing station (not shown).

At block 408, the method 400 applies a primer on the UV ink to form a primer layer. For example, the primer may be applied or jetted onto the UV ink via the same print head that dispenses the UV ink or a different print head. The primer may be any type of UV curable, ink jettable primer.

At block 410, the method 400 cures the UV ink and the primer. For example, a UV curing station may apply UV energy or light onto the UV ink and the primer. The UV curing station may activate, harden, or dry the UV ink and the primer.

At block 412, the method 400 applies a second liner onto the primer layer that is cured. In one embodiment, the second liner may be a release liner. The second liner may be any type of liner having a lower adhesion than the primer layer. As a result, the second liner may be removably attached to the primer layer for handling and transportation. Examples of suitable materials for the second liner may include polypropylene, polyethylene, and the like.

In one embodiment, after the second liner is applied the UV transferrable material may be completed. The UV transferrable material may then easily be applied to a surface in a desired pattern and a desired spacing. For example, the second liner may be removed. The exposed primer layer may have adhesive properties. The primer layer may be applied to a surface (e.g., a glass surface, a metal surface, a wall, and the like). After the primer layer is applied, the first liner may be removed. The transfer of the UV transferrable material onto the desired surface may then be completed. At block 414, the method 400 ends.

It should be noted that the blocks in FIG. 4 that recite a determining operation or involve a decision do not necessarily require that both branches of the determining operation be practiced. In other words, one of the branches of the determining operation can be deemed as an optional step. In addition, one or more steps, blocks, functions or operations of the above described method 400 may comprise optional steps, or can be combined, separated, and/or performed in a different order from that described above, without departing from the example embodiments of the present disclosure.

FIG. 5 depicts a high-level block diagram of a computer that is dedicated to perform the functions described herein. As depicted in FIG. 5, the computer 500 comprises one or more hardware processor elements 502 (e.g., a central processing unit (CPU), a microprocessor, or a multi-core processor), a memory 504, e.g., random access memory (RAM) and/or read only memory (ROM), a module 505 for producing a UV printed transferrable material, and various input/output devices 506 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the computer may employ a plurality of processor elements.

It should be noted that the present disclosure can be implemented in software and/or in a combination of software and hardware deployed on a hardware device, a computer or any other hardware equivalents (e.g., the system 300). For example, computer readable instructions pertaining to the method(s) discussed above can be used to configure a hardware processor to perform the steps, functions and/or operations of the above disclosed methods. In one embodiment, instructions and data for the present module or process 505 for producing a UV printed transferrable material (e.g., a software program comprising computer-executable instructions) can be loaded into memory 504 and executed by hardware processor element 502 to implement the steps, functions or operations as discussed above in connection with the example method 400. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 505 for producing a UV printed transferrable material (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. An ultraviolet (UV) printed transferrable material, comprising:
 a first liner;
 a UV ink layer on top of the first liner in a desired image;
 a primer layer on top of the UV ink layer, wherein the UV ink layer and the primer layer are cured; and
 a second liner on top of the primer layer.

2. The UV printed transferrable material of claim 1, wherein the first liner comprises a removable liner having a surface energy of approximately 30 to 35 dynes per square centimeter.

3. The UV printed transferrable material of claim 2, wherein the first liner comprises a low density polyethylene.

4. The UV printed transferrable material of claim 1, wherein the second liner comprises a release liner having a lower adhesion than the primer layer.

5. The UV printed transferrable material of claim 4, wherein the second liner comprises at least one of: polypropylene or polyethylene.

6. The UV printed transferrable material of claim 1, wherein the UV ink layer comprises a thickness of approximately 5-70 microns.

7. The UV printed transferrable material of claim 1, wherein the desired image comprises a plurality of different images that are arranged in a desired pattern having a desired spacing.

8. The UV printed transferrable material of claim 1, wherein the primer layer comprises a UV curable, ink jettable, primer.

9. A method for producing an ultraviolet (UV) transferrable material, comprising:
 providing a first liner;
 applying a UV ink on the first liner;
 applying a primer on the UV ink to form a primer layer;
 curing the UV ink and the primer; and
 applying a second liner onto the primer layer that is cured.

10. The method of claim 9, further comprising:
 applying a corona plasma to the first liner to lower the surface energy of the first liner.

11. The method of claim 9, wherein the applying comprises:
 dispensing a plurality of different colored UV inks to print the desired image.

12. The method of claim 9, wherein the applying comprises:
 dispensing the UV ink in a plurality of different passes to print the desired image to a desired thickness.

13. The method of claim 12, wherein the desired thickness comprises approximately 5 to 70 microns.

14. The method of claim 9, further comprising:
 removing the second liner;
 applying the primer layer onto a surface; and
 removing the first liner.

15. The method of claim 14, wherein the desired image is applied to the surface in a desired pattern having a desired spacing.

16. The method of claim 9, wherein the first liner comprises a removable liner having a surface energy of approximately 30 to 35 dynes per centimeter.

17. The method of claim 16, wherein the first liner comprises a low density polyethylene.

18. The method of claim 9, wherein the second liner comprises a release liner having a lower adhesion than the primer layer.

19. The method of claim 18, wherein the second liner comprises at least one of: polypropylene or polyethylene.

20. An ultraviolet (UV) printed transferrable material, comprising:
 a low density polyethylene liner:
 a UV ink layer on top of low density polyethylene liner in a desired image, wherein the UV ink layer comprises a plurality of different UV ink colors and the desired image comprises a series of letters in a desired pattern having a desired spacing;
 a primer layer on top of the UV ink layer, wherein the UV ink layer and the primer layer are cured; and
 a release liner on top of the primer layer, wherein the release liner is removed first to apply the primer layer to a surface and the low density polyethylene liner is removed last after the primer layer is applied to a surface.

* * * * *